United States Patent [19]

Noguchi et al.

[11] Patent Number: 4,963,836

[45] Date of Patent: Oct. 16, 1990

[54] WIDE RANGE HIGH STABILITY VARIABLE GAIN AMPLIFIER

[75] Inventors: Robert Y. Noguchi; Lawrence E. Roohr, both of Colorado Springs, Colo.

[73] Assignee: Digital Equipment Corporation, Maynard, Mass.

[21] Appl. No.: 370,803

[22] Filed: Jun. 23, 1989

[51] Int. Cl.⁵ .............................................. H03F 3/45
[52] U.S. Cl. .................................... 330/254; 330/256
[58] Field of Search ............... 330/252, 254, 256, 257, 330/279, 289, 310

[56] References Cited

U.S. PATENT DOCUMENTS

4,769,588  9/1988  Panther ........................... 330/256 X
4,853,647  8/1989  Low et al. ........................... 330/256

Primary Examiner—Steven Mottola
Attorney, Agent, or Firm—Neuman, Williams, Anderson & Olson

[57] ABSTRACT

A variable gain amplifier system with a temperature stabilized exponential control signal input and wide range amplifier.

27 Claims, 2 Drawing Sheets

WIDE RANGE HIGH STABILITY VARIABLE GAIN AMPLIFIER

The present invention relates to variable gain amplifier systems, and more particularly to variable gain amplifiers with environmentally stable feedback systems.

BACKGROUND OF THE INVENTION

Variable gain amplifier systems are useful for a large range of applications where a signal is to be amplified by some amplification factor and the amplification factor is modified by a gain control signal Such amplifiers are particularly useful for automatic gain control systems when the amplification factor of the variable gain amplifier has an exponential relationship to the gain control signal. However, the variable gain amplifier systems in use suffer from the sensitivity of transistor transconductance to variations in temperature. This sensitivity to temperature variation causes corresponding changes in the system gain. For variable gain systems with exponential gain control characteristics, such temperature sensitivity can cause very objectional variations in amplifier output. Furthermore, variable gain amplifier systems in use are gain limited by small signal emitter resistance in their gain controlling stages, so that their range of gain change is thereby limited.

SUMMARY OF THE INVENTION

The present invention overcomes the disadvantages of the prior art variable gain amplifier systems with a two stage amplifier system comprising a current biased differential amplifier with an exponential gain control circuit provided by a temperature stabilized variable transconductance differential amplifier. The small signal transistor emitter resistance error is minimized with current biasing which is independent of the gain controlling current in the system. The balanced circuit configuration is particularly suited to integrated circuit implementation because the characteristics of the components are easily matched.

DETAILED DESCRIPTION OF THE PREFERRED EMBODIMENT

Figure 1:
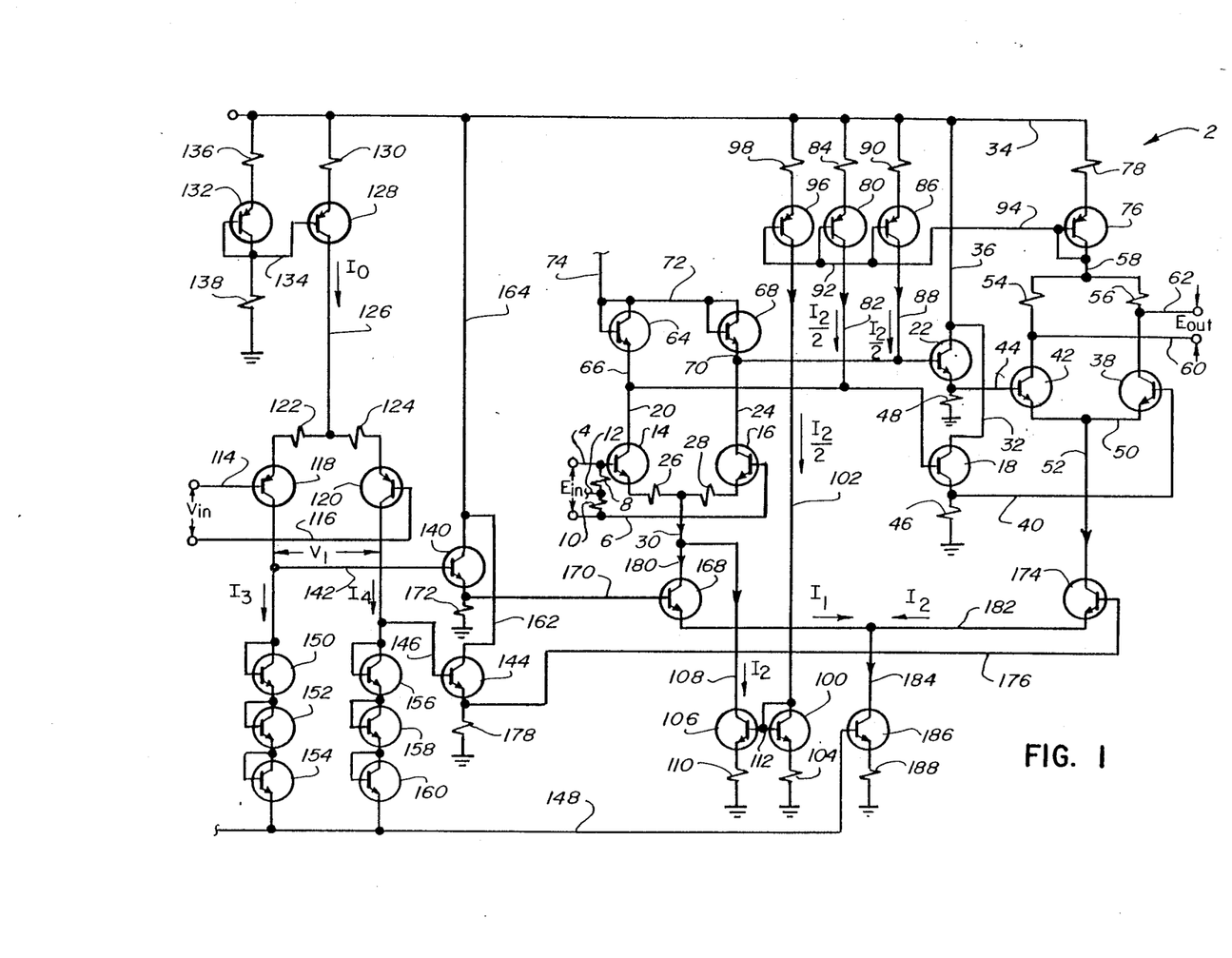
FIG. 1 is a schematic diagram of a preferred embodiment of the present invention.

Referring to the drawings, wherein the reference characters designate like or corresponding parts throughout the views, FIG. 1 is a schematic diagram of a preferred embodiment of the invention. A variable gain control system 2 includes an amplifier input $e_{in}$ across a first input line 4 and a second input line 6. The line 4 and line 6 are both balanced with respect to the circuit ground. A resistance 8 and a resistance 10 are serially connected from the line 4 to the line 6 to permit the introduction of a steady state potential offset on the line 4 and the line 6 relative to the circuit ground. This offset may be provided by a steady state input bias potential between a line 12 connecting the intersection of the resistance 8 and the resistance 10 and the circuit ground.

The line 4 is coupled to the base of a first NPN input transistor 14, and the line 6 is coupled to the base of a second NPN input transistor 16. The first input transistor 14 has its collector coupled to the base of a first NPN transistor driver 18 via a line 20. The second input transistor 16 has its collector coupled to the base of a second NPN transistor driver 22 via a line 24. A resistance 26 and a resistance 28 are serially connected from the emitter of the first input transistor 14 to the emitter of the second input transistor 16 to permit a common current return path. This common current return path is provided on a line 30 coupled to the intersection of the resistance 26 and the resistance 28.

The first driver transistor 18 has its collector coupled to the collector of the second driver transistor 22 via a line 32. The collectors of the first driver transistor 18 and the second driver transistor 22 are coupled to a common source potential via a common source line 34 connected to the line 32 via a line 36. The emitter of the first driver transistor 18 is coupled to the base of a first NPN output transistor 38 via a line 40. The emitter of the second driver transistor 22 is coupled to the base of a second NPN output transistor 42 via a line 44. The emitter of the first driver transistor 18 is loaded with a resistance 46 coupled to the circuit ground. The emitter of the second driver transistor 22 is loaded with a resistance 48 coupled to the circuit ground.

The emitter of the first output transistor 38 is connected to the emitter of the second output transistor 42 via a line 50. A common current return path for the emitters of the first output transistor 38 and the second output transistor 42 is provided on a line 52. A resistance 54 and a resistance 56 are serially connected from the collector of the first output transistor 38 to the collector of the second output transistor 42 to provide a common source supply path. This common source supply path is provided on a line 58 coupled to the intersection of the resistance 54 and the resistance 56. A first output line 60 coupled to the collector of the first output transistor 38 and a second output line 62 coupled to the collector of the second output transistor 42 provide a balanced output $e_{out}$ between them relative to the circuit ground.

The above-described configuration is the heart of a two stage amplifier circuit with a balanced input and a balanced output relative to circuit ground, including a provision for bias of the input. As part of the gain control for this circuit, a first NPN bias transistor 64 has its emitter coupled to the collector of the first input transistor 14 via a line 66 and a second NPN bias transistor 68 has its emitter coupled to the collector of the second output transistor 16 via a line 70. The bases and collectors of the first bias transistor 64 and the second bias transistor 68 are all coupled together via a line 72. The transistors 64 and 68 serve as load resistances for the first input transistor 14 and the second input transistor 16 which vary with the current passing through them. A bias potential is coupled to the line 72 via a line 74 to provide a bias for the first driver transistor 22 and the second driver transistor 24.

The amplifier circuit includes a current biasing arrangement which maintains a relatively large constant current through the first input transistor 14 and the second input transistor 16, thereby keeping their small signal equivalent resistances small independent of stage gain. The arrangement includes a PNP current mirror control transistor 76 having its base and collector coupled to the line 58. The emitter of the current mirror control transistor 76 is coupled to the common source potential line 34 with a resistance 78. The current through the transistor 76 is the sum of the currents through the transistors 38 and 42.

A first PNP current mirror transistor 80 has its collector coupled to the collector of the first input transistor 14 via a line 82. The emitter of the first current mirror transistor 80 is coupled to the common source potential line 34 with a resistance 84. Likewise, a second PNP current mirror transistor 86 has its collector coupled to the collector of the second input transistor 16 via a line 88. The emitter of the second current mirror transistor 86 has its emitter coupled to the common source potential line 34 through a resistance 90. The bases of the first current mirror transistor 80 and the second current mirror transistor 86 are coupled together via a line 92. The collector and base of the current control mirror transistor 76 is coupled to the base of the first constant current transistor 80 and the second constant current transistor 86 via a line 94. The quiescent currents through the first current mirror transistor 80 and the second current mirror transistor 86 with respect to the current mirror control transistor 76 are established by the resistance 84 and resistance 90, with respect to the resistance 78. When the resistance 84 and the resistance 90 are identical, the currents through the first current mirror transistor 80 and the second current mirror transistor 86 are the same. The current passing through these transistors is proportional to the current through the current mirror control transistor 76. A PNP current mirror buffer transistor 96 has its emitter coupled to the common source potential line 34 through a resistance 98. The collector of the transistor 96 is coupled to the collector and base of an NPN current mirror control transistor 100 via a line 102. The emitter of the transistor 100 is coupled to the circuit ground through a resistance 104.

The base of the current mirror buffer transistor 96 is coupled to the collector and base of the current mirror control transistor 76. Thus, the current passing through the transistor 96 is proportional to the current passing through the current mirror control transistor 76.

An NPN current mirror transistor 106 has its collector coupled to the line 30 via a line 108. The emitter of the constant current input transistor 106 is coupled to the circuit ground through a resistance 110. The base of the transistor 106 is connected to the collector and base of the current mirror control transistor 100 via a line 112. Consequently, the current passing through the current mirror transistor 106 is proportional to that passing through the current mirror control transistor 100, and since the current passing through the current mirror control transistor 100 is the same as that passing through the current mirror buffer transistor 96, which current is in turn proportional to that passing through the current mirror control transistor 76, the current through the current mirror transistor 106 is proportional to the current passing through the current mirror control transistor 76.

Of course, since the currents through the first current mirror transistor 80 and the second current mirror transistor 86 are also both proportional to the current flowing through the current mirror control transistor 76, the resistances 84, 90, 98, 104 and 110 are proportioned to let the current contributed by the first current mirror transistor 80 plus the second current mirror transistor 86 equal the current through the current mirror transistor 106. If these current values are relatively high, the effective emitter resistances of the first input transistor 14 and the second input transistor 16 become very low.

It may be seen that high quiescent current causes no detrimental effect upon amplification, since the balanced input signal between the lines 4 and 6 causes a differential current flow between the first input transistor 14 and the second input transistor 16. In practice, the currents passing through each one of the resistances 84, 90, 98 and 100 are adjusted to be approximately half of the current passing through the transistor 76, while the current passing through the transistor 106 is adjusted to be the same as that passing through the transistor 76. When so adjusted, gain variation due to temperature and operating conditions is minimized, as explained in more detail below.

The current-biased amplifier circuit described above is coupled to a gain-control circuit which provides an overall gain which is exponentially proportional to a control signal. The circuit includes a gain control input $V_{in}$ across a first gain control line 114 and a second gain control line 116. The line 114 and the line 116 are both balanced with respect to the circuit ground. The line 114 is coupled to the base of a first PNP control signal input transistor 118, and the line 116 is coupled to the base of a second PNP control signal input transistor 120. A resistance 122 and a resistance 124 are serially connected from the emitter of the first control input transistor 118 to the emitter of the second control input transistor 120 to provide a common emitter current path. This common emitter current path is provided by a line 126 connected to the intersection of the resistance 122 and resistance 124. The line 126 is coupled to the collector of a PNP constant current supply transistor 128. The emitter of the constant current supply transistor 128 is coupled to the common source potential line 34 through a resistance 130.

A constant current reference control transistor 132 has its base and collector coupled to the base of the transistor 128 via a line 134. The emitter of the transistor 132 is coupled to the common emitter source line 34 through a resistance 136. The collector of the transistor 132 is coupled to the circuit ground through a resistance 138. The potential at the base of the constant current reference control transistor 132 is constant, since the values of the resistance 136 and the resistance 138 coupled to it remain in fixed ratio to each other. Consequently, the current through the constant current supply transistor 128 is determined by the resistance 130 and the potential at the base of the transistor 132.

The collector of the first control signal input transistor 118 is coupled to the base of a first NPN gain control driver transistor 140 via a line 142. The collector of the second control signal input transistor 120 is coupled to the base of a second NPN gain control driver transistor 144 via a line 146. The collector of the first control transistor 118 has a load to a collector current bias potential supplied on a collector current bias source line 148 through a diode string of serially connected first collector diodes 150, 152 and 154. Although the diodes 150, 152 and 154 are shown as diode-connected transistors in FIG. 1, ordinary diodes with the desired characteristics may also be used. Likewise, the collector of the second control transistor 120 has a load to the collector current bias source line 148 through a diode string of second collector diodes 156, 158 and 160. Although the diodes 156, 158 and 160 are shown as diode-connected transistors in FIG. 1, ordinary diodes with the desired characteristics may also be used. The diode strings which load the collectors of the transistor 118 and the transistor 120 provide logarithmic potential drops proportionately to the diode thermal potential $V_T$. The differential potential across the diode strings is kept small by system constraints, and therefore closely approximates a linear function.

The collectors of the first gain control driver transistor 140 and the second gain control driver transistor 144 are coupled together by a line 162, and they are also coupled to the common source potential line 34 via a line 164. The emitter of the first gain control driver transistor 140 is coupled to the base of an NPN input amplifier input current control transistor 168 via a line 170. The emitter of the transistor 140 is loaded through a resistance 172 to the circuit ground. The emitter of the second gain control driver transistor 144 is coupled to the base of an NPN output amplifier current control transistor 174 via a line 176. The emitter of the transistor 144 is loaded through a resistance 178 to the circuit ground. The difference in potentials on the lines 170 and 176 produced by a gain control input signal across the lines 114 and 116 will therefore be proportional to the gain control input signal and the diode thermal potential $V_T$ over a small range of allowed gain control signal amplitude due to the first collector diodes 150, 152 and 154, and the diode string of the second collector diodes 156, 158 and 160, which in this application will be both approximately linear due to system constraints and proportional to the diode thermal potential $V_T$ inherent in diode large signal current-to-potential relationships.

The collector of the input amplifier current control transistor 168 is connected to the line 30 via a line 180. All the current passing through the transistors 64 and 68 equals the current through the transistor 168, which is exponential with respect to the differential signal on the lines 170 and 176. The collector of the output amplifier current control transistor 174 is coupled to the line 52. Thus, the current passing through the emitters of first output transistor 38 and the second output transistor 42 is passed through the transistor 174, which current is exponential with respect to the differential signal on the lines 170 and 176. The emitters of the input amplifier current control transistor 168 and the output amplifier current control transistor 174 are coupled together via a line 182 to compromise an exponential transconductance amplifier. The emitters of the transistor 168 and the transistor 174 have a common current path on a line 184 coupled to the line 182.

The collector current bias potential on the line 148 is coupled to the base of an NPN constant current source transistor 186. The collector of the transistor 186 is coupled to the line 184. The emitter of the transistor 186 is coupled to the circuit ground through a resistance 188.

Temperature stability of the variable gain control system 2 described above is achieved by first selecting identical resistance values and temperature coefficients for the resistance 26, the resistance 28, the resistance 54 and the resistance 56 so that the emitter loads on the first input transistor 14 and the second input transistor 16 are substantially the same as the collector loads on the first output transistor 38 and the second output transistor 42. In addition, the resistance 84, the resistance 90 and the resistance 98 are selected to set the quiescent current levels through each of the transistors 80, 86 and 96 to be one half of the total current passing through the first output transistor 38 and the second output transistor 42. Finally, the resistance 104 and the resistance 110 are selected to set the quiescent current through the transistor 106 to be the same as the total current of the first output transistor 38 and the second output transistor 42.

With the establishment of these conditions, the amplifier gain may be expressed as:

$$I_2/I_1 = \frac{r_{eq64}}{r_{eq38}} = \frac{r_{eq68}}{r_{eq42}} \quad \text{(Eq. 1)}$$

wherein:
$I_1$ = current through the transistor 168
$I_2$ = current through the transistor 174
$r_{eq38}$ = small signal emitter resistance of the transistor 38
$r_{eq42}$ = small signal emitter resistance of the transistor 42
$r_{eq64}$ = small signal emitter resistance of the transistor 64
$r_{eq68}$ = small signal emitter resistance of the transistor 68

This expression is independent of thermal potential ($V_T$) of the transistor, and therefore the gain is independent of temperature. The circuit gain error which would normally be introduced by the small signal emitter resistance of the first input transistor 14 and the second input transistor 16 is swamped out by the high quiescent current supplied through the transistor 80 and the transistor 86. These small signal emitter resistances are thereby kept to a constant small value independent of the gain controlling current $I_1$ shown in Eq. 1.

The current ratio expression $I_2/I_1$, shown in Eq. 1, which controls gain of the system 2, has an exponential nature and remains independent of temperature when the gain-controlling portion of the system 2 is adjusted as follows. The values of the resistance 122 and the resistance 124 are selected to be identical and the first collector diodes 150, 152 and 154, and the second collector diodes 156, 158 and 160 are selected to have identical characteristics, so that differential potential between the emitters of the first control signal input transistor 118 and the second control signal input transistor 120, represented as $V_1$, is dependent on the expression:

$$I_3/I_4 = \frac{1 + \dfrac{V_{in}}{R_E I_o}}{1 - \dfrac{V_{in}}{R_E I_o}} \quad \text{(Eq. 2)}$$

wherein:
$I_3$ = current through the transistor 118
$I_4$ = current through the transistor 120
$V_{in}$ = potential of the control signal between the line 114 and the line 116
$R_E$ = resistance of the resistance 122 and the resistance 124
$I_o$ = current through the transistor 128

Because the current $I_o$ as expressed in Eq. 2 is set by the resistance of the resistance 130, which tracks the resistance 122 and the resistance 124 with temperature, the current $I_o$ varies inversely with the resistances 122 and 124. Since the resistance 122 and the resistance 124 are equal, the ratio $I_3/I_4$, is independent of temperature.

The potential $V_1$ also dependent upon the potential drops across the diodes 150, 152 and 154 due to the current $I_3$ and the potential drops across the diodes 156, 158 and 160 due to the current $I_4$. It may be expressed as follows:

$$V_1 = n V_t \ln(I_3/I_4) \quad \text{(Eq. 3)}$$

wherein:
$V_T$ = thermal potential factor in each of the first collector diodes 150, 152 and 154, and the second collector diodes 156, 158 and 160 in potential equation.
n = number of diodes in each string.

By applying the mathematical identities $$\ln\frac{1+x}{1-x} = 2\tanh^{-1}x \text{ and } \tanh^{-1} = x + \frac{x^3}{3} + \frac{x^5}{5} + \ldots$$

the expression for $V_1$ may be approximated as:

$$V_1 = 2nV_T\tanh^{-1}\frac{V_{in}}{R_E I_o} \approx 2nV_T\frac{V_{in}}{R_E I_o} \quad \text{(Eq. 4)}$$

with less than a two percent error for values of $$\frac{V_{in}}{R_E I_o} < 0.240$$

The overall gain of the variable gain control system as described above, represented as $A_S$ is therefore:

$$A_S = \frac{I_2}{I_1} \approx e^{\frac{2nVI\frac{V_{in}}{R_E I_o}}{V_T}} = e^{\frac{2nV_{in}}{R_E I_o}} \quad \text{(Eq. 5)}$$

It is apparent that the gain $A_S$ for the system 2 is both exponential in form and independent of temperature. Of course, any number of diodes may be used in the diode strings of the system 2 described above to change the exponential gain control relationship.

Figure 2:
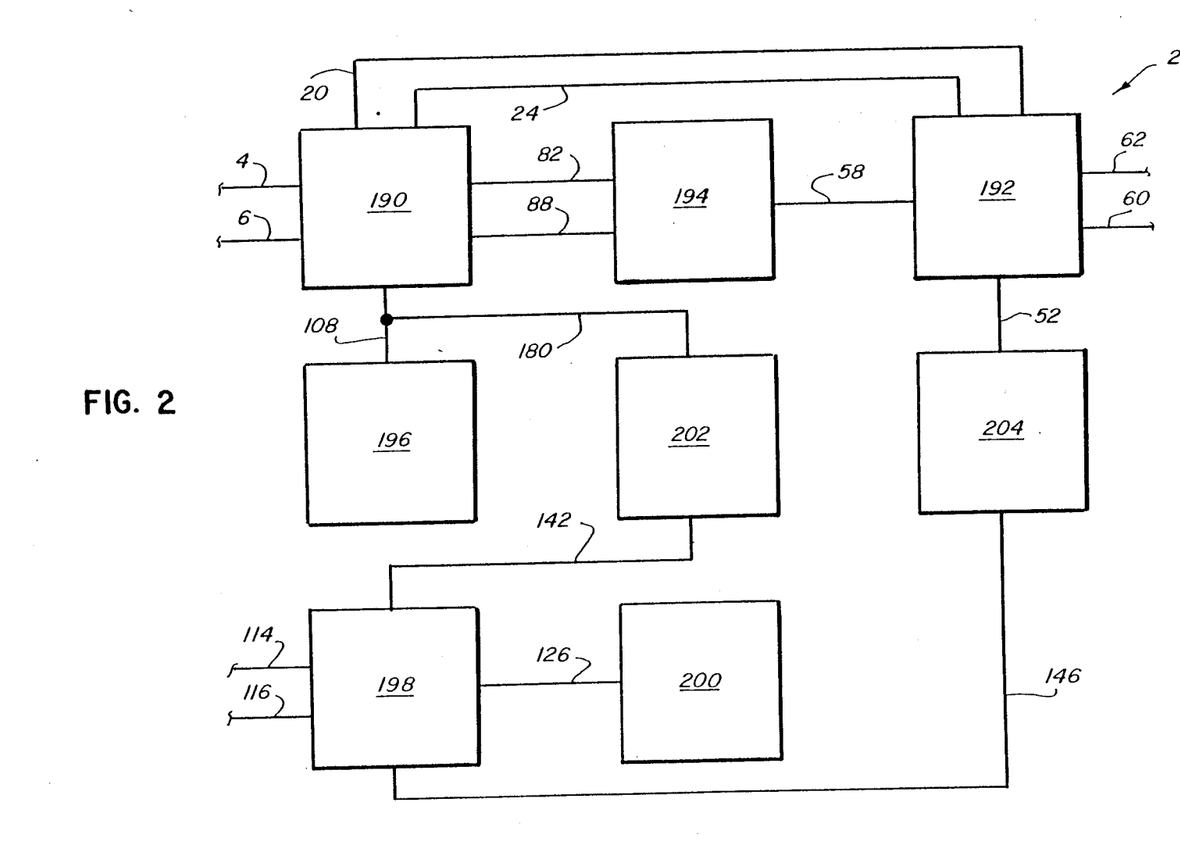
FIG. 2 is a block diagram of the preferred embodiment shown in FIG. 1.

The amplifier system 2 described above in connection with FIG. 1 is shown in block form in FIG. 2, with blocks representing the elements of the preferred embodiment. A differential input amplifier 190, generally representing the circuitry associated with the transistors 14, 16, 64 and 68 in FIG. 1, has the lines 4 and 6 for an input signal. A differential output amplifier 192, generally representing the circuitry associated with the transistors 18, 22, 38 and 42 in FIG. 1, is driven by the input amplifier 190 via the lines 20 and 24 and has an output signal across the lines 60 and 62.

An input amplifier current source control circuit 194, generally representing the circuitry associated with the transistors 76, 80 and 86 in FIG. 1, supplies separate constant currents to the input amplifier 190 on the lines 82 and 88, each of the two currents maintained by the control circuit 194 at one half of the output amplifier supply current on the line 58 between the control circuit 194 and the output amplifier 192. An input amplifier current return control circuit 196, generally representing the circuitry associated with the transistors 76, 96, 100 and 106 in FIG. 1, returns a constant current from the input amplifier 190 on the line 108 which is maintained at the total current level of the output amplifier supply current on the line 58.

A differential gain control amplifier 198, generally representing the circuitry associated with the transistors 118, 120, 150, 152, 154, 156, 158, 160 and 186 in FIG. 1, has a gain control signal input across the lines 114 and 116. The gain control amplifier 198 has a gain control amplifier current return control circuit 200, generally representing the circuitry associated by the transistors 128 and 132 in FIG. 1, which regulates its total amplifier return current on the line 126.

The differential gain control amplifier 198 drives an input amplifier control circuit 202, generally representing the circuitry associated with the transistor 140 and 168 in FIG. 1, via the line 142, for regulating the input amplifier return current on the line 180. The gain control amplifier 198 also drives an output amplifier control circuit 204, generally representing the circuitry associated with the transistors 144 and 174 in FIG. 1, via the line 146 for regulating the output amplifier return current on the line 52.

Thus, there has been described herein a wide range, environmentally stable amplifier system which provides an amplification factor which is exponentially proportioned to a gain control input signal. It will be understood that various changes in the details, arrangements and configurations of the parts and system which have been described and illustrated above in order to explain the nature of the present invention may be made by those skilled in the art within the principle and scope of the present invention as expressed in the appended claims:

What is claimed is:

1. A temperature stabilized amplifier circuit having an amplification factor exponentially proportional to a gain control signal for amplifying input signals comprising:
    a differential input amplifier for receiving said input signals and providing a differential amplifier signal linearly proportional to said input signals, said input amplifier having a differential current supply input and a current return output;
    a differential output amplifier for receiving said differential amplifier signal and providing an amplified output signal proportional to said amplifier signal, said output amplifier having a current supply input and a current return output;
    a differential gain control amplifier for receiving said gain control signal and providing a differential gain control amplifier signal exponentially proportional to said gain control signal, said gain control amplifier having a current return output;
    gain control amplifier current return control means for regulating current returned from said gain amplifier current return output at a selected level;
    input amplifier current source control means for supplying a first input current and a second input current to said input amplifier differential current supply input, each at a level of approximately one half of the current fed to said output amplifier current supply input;
    input amplifier current return control means for returning current from said input amplifier current return output in inverse linear proportion to said gain control amplifier signal; and
    output amplifier control means for returning current from said output amplifier current return output in direct linear proportion to said gain control amplifier signal.

2. The amplifier circuit recited in claim 1, wherein said gain control amplifier current return control means comprises a constant current regulation circuit for regulating current returned from said gain control amplifier current return output at said selected level.

3. The amplifier circuit recited in claim 1, wherein said input amplifier current source control means comprises a current mirror circuit for regulating said first input current and said second input current in said linear proportion to the current fed to said output amplifier current supply input.

4. The amplifier circuit recited in claim 1, wherein said input amplifier current return control means comprises a current mirror circuit for regulating current returned from said input amplifier current return output in said linear proportion to the current fed to said output amplifier current supply input.

5. The amplifier circuit recited in claim 1, wherein said input amplifier current return control means comprises a current regulation circuit for controlling current returned from said input amplifier current return line in said inverse proportion to said gain control amplifier signal.

6. The amplifier circuit recited in claim 1, wherein said output amplifier circuit return control means comprises a current regulation circuit for controlling current returned from said output amplifier current return line in said direct proportion to said gain control amplifier signal.

7. The circuit recited in claim 1, wherein said circuit comprises an integrated circuit device.

8. A circuit for amplifying an input signal having an amplification factor exponentially proportional to a gain control signal, comprising:

a differential input amplifier for receiving said input signal across a first signal input and a second signal input, said first signal input controlling a first input amplifier current to an input amplifier common return line to produce a first input amplifier signal, and said second signal input controlling a second input amplifier current to said input amplifier common return line to produce a second input amplifier signal;

a differential output amplifier for receiving said first amplifier signal on a first driver input and said second amplifier signal on a second driver input, said first driver input controlling a first output current from a common output amplifier supply line to a common output amplifier return line to produce a first output signal, said second driver input controlling a second output current from said common output amplifier supply line to said common output amplifier return line to produce a second output signal, said common output amplifier input line and said common output amplifier return line carrying a total output amplifier current which is substantially the sum of said first output amplifier current and said second output amplifier current, the difference between said first output signal and second output signal producing an amplified output signal;

input amplifier current source control means for supplying said first input amplifier current and said second input amplifier current each at a level of substantially one half of said total output amplifier current;

input amplifier current return control means for regulating current from said common amplifier current return line at a level substantially the same as said total output amplifier current;

a differential gain control amplifier for receiving said gain control signal across a first control signal input and a second control signal input, said first control signal input controlling a first gain control amplifier current from through a selected number of first semiconductor junctions to a common gain amplifier current return line and said second control signal input controlling a second gain control amplifier current from through said selected number of second semiconductor junctions to said common gain amplifier current return line;

gain control amplifier current return control means for regulating current from said common gain amplifier current return line at a selected level;

input amplifier control means, coupled to said first semiconductor junctions, for regulating current from said common input amplifier current return line to a common amplifier circuit return line at a level proportional to the potential developed across said first semiconductor junctions; and output amplifier control means, coupled to said second semiconductor junctions, for regulating current from said common output amplifier current return line to said common amplifier circuit return line at a level proportional to the potential developed across said second semiconductor junctions.

9. The circuit recited in claim 8, wherein said input amplifier source control means comprises:

a first input amplifier current mirror circuit for supplying said first input amplifier current in said proportion to said total amplifier output current; and a second input amplifier current mirror circuit for supplying said second input amplifier current in said proportion to said total amplifier output current.

10. The circuit recited in claim 8, wherein said input amplifier current return control means comprises an input amplifier current mirror circuit for regulating said current from said common input amplifier return line in said proportion to said total amplifier output current.

11. The circuit recited in claim 8, wherein said gain control amplifier current return control means comprises a gain control amplifier constant current regulation circuit for regulating current from said common gain control amplifier current return line at said selected level.

12. The circuit recited in claim 8, wherein said input amplifier control means comprises an input amplifier current control circuit for controlling said current from said input amplifier current return line to said common amplifier return line in proportion to said potential developed across said first semiconductor functions.

13. The circuit recited in claim 8, wherein said output amplifier control means comprises an output amplifier current control circuit for controlling said current from said common output amplifier current return line to said common amplifier circuit return line in proportion to said potential developed across said second semiconductor junctions.

14. The circuit recited in claim 8, wherein said circuit comprises an integrated circuit device.

15. A circuit for amplifying an input signal having an amplification factor exponentially proportional to gain control signal, comprising:

a differential input amplifier for receiving said input signal across a first signal input and a second signal input, said first signal input controlling a first input amplifier current through a first input resistance to a common input amplifier return line to produce a first input amplifier signal, and said second signal input controlling a second input amplifier current through a second input resistance to said common input amplifier current return line to produce a second input amplifier signal;

a differential output amplifier for receiving said first amplifier signal on a first driver input and said second amplifier signal on a second driver input, said first driver input controlling a first output current through a first output resistance to a common output amplifier current supply line to produce a first output signal and said second driver input controlling a second output amplifier current through a second output resistance to said common output amplifier current supply line to produce a second output signal, said common output amplifier supply line carrying a total output amplifier current which is substantially the sum of said first output amplifier current and said second amplifier output current, the difference between said first output signal and second output signal producing an amplified output signal;

input amplifier current source control means for supplying said first input amplifier current and said second input amplifier current each at a level of substantially one half of said total output amplifier current;

input amplifier current return control means for regulating current from said common amplifier current return line at a level substantially the same as said total output amplifier current;

a differential gain control amplifier for receiving said gain control signal across a first control signal input and a second control signal input, said first control signal input controlling a first gain control amplifier current from through a selected number of first semiconductor junctions to a common gain amplifier current return line and said second control signal input controlling a second gain control amplifier current from through said selected number of second semiconductor junctions to said common gain amplifier current return line;

gain control amplifier current return control means for regulating current from said common gain amplifier current return line at a selected level;

input amplifier control means, coupled to said first semiconductor junctions, for regulating current from said common input amplifier current return line to a common amplifier circuit return line at a level proportional to the potential developed across said first semiconductor junctions; and output amplifier control means, coupled to said second semiconductor junctions, for regulating current from said common output amplifier current return line to said common amplifier circuit return line at a level proportional to the potential developed across said second semiconductor junctions.

16. The circuit recited in claim 15, wherein said first input resistance, said second input resistance, said first output resistance and said second output resistance have equal values.

17. The circuit recited in claim 16, wherein said selected number of said first semiconductor junctions is three and said selected number of second semiconductor junctions is three.

18. The circuit recited in claim 17, wherein said input amplifier source control means comprises:

a first input amplifier current mirror circuit for supplying said first input amplifier current in said proportion to said total amplifier output current; and a second input amplifier current mirror circuit source for supplying said second input amplifier current in said proportion to said total amplifier output current.

19. The circuit recited in claim 17, wherein said input amplifier current return control means comprises an input amplifier current mirror circuit for regulating said current from said common input amplifier return line in proportion to said total amplifier output current.

20. The circuit recited in claim 19, wherein said gain control amplifier means comprises a gain control amplifier constant current regulation circuit for regulating current from said common gain control amplifier current return line at said selected level.

21. The circuit recited in claim 19, wherein said input amplifier control means comprises an input amplifier current control circuit for controlling said current from said input amplifier current return line to said common amplifier return line in proportion to said potential developed across said first semiconductor junctions.

22. The circuit recited in claim 19, wherein said output amplifier control means comprises an output amplifier current control circuit for controlling said current from said common output amplifier current return line to said common amplifier circuit return in proportion to said potential developed across said second semiconductor junctions.

23. The circuit recited in claim 19, wherein said circuit comprises an integrated circuit device.

24. A circuit for amplifying an input signal having an amplification factor exponentially proportional to a gain control signal comprising:

a differential input amplifier for receiving said input signal across a first signal input and a second signal input, said first signal input controlling a first input amplifier current through a first input resistance to an input amplifier common return line to produce a first input amplifier signal, said second signal input controlling a second input amplifier current through a second input resistance to said input amplifier common return line to produce a second input amplifier signal;

a differential output amplifier for receiving said first amplifier signal on a first driver input and said second amplifier signal on a second driver input, said first driver input controlling a first output current from a common output amplifier supply line through a first output resistance to a common output amplifier return line to produce a first output signal, said second driver input controlling a second output current from said common output amplifier supply line through a second output resistance to said common output amplifier return line to produce a second output signal, said common output amplifier input line and said common output amplifier return line carrying a total output amplifier current which is substantially the sum of said first output amplifier current and said second output amplifier current, the difference between said first output signal and second output signal producing an amplified output signal;

a first input amplifier source current mirror circuit for supplying said first input amplifier at a level of substantially one half of said total amplifier output current;

a second input amplifier source current mirror circuit for supplying said second input amplifier current at a level of substantially one half of said total amplifier output current;

an input amplifier return current mirror circuit for regulating said current from said common input amplifier return line at a level of substantially one half of said total amplifier output current;

a differential gain control amplifier for receiving said gain control signal across a first control signal input and a second control signal input, said first control signal input controlling a first gain control amplifier current from through a selected number of first semiconductor junctions to a common gain amplifier current return line and said second control signal input controlling a second gain control amplifier current from through said selected number of second semiconductor to said common gain amplifier current return line;

a gain control amplifier constant regulation circuit regulating current from said common gain amplifier current return line at a selected level;

an input amplifier current control circuit, coupled to said first semiconductor junctions, for regulating current from said common input amplifier current return line to a common amplifier circuit return line at a level proportional to the potential developed across said first semiconductor junctions; and an output amplifier current control circuit, coupled to said second semiconductor junctions, for regulating current from said common output amplifier current return line to said common amplifier circuit return line at a level proportional to the potential developed across said second semiconductor junctions.

25. The circuit recited in claim 24, wherein said first input resistance, said second input resistance, said first output resistance and said second output resistance have equal values.

26. The circuit recited in claim 25, wherein said selected number of said first semiconductor junctions is three and said selected number of second semiconductor junctions is three.

27. The circuit recited in claim 26, wherein said circuit comprises an integrated circuit device.

* * * * *

UNITED STATES PATENT AND TRADEMARK OFFICE
CERTIFICATE OF CORRECTION

PATENT NO. : 4,963,836

DATED : October 16, 1990

INVENTOR(S) : Robert Y. Noguchi and Lawrence E. Roohr

It is certified that error appears in the above-identified patent and that said Letters Patent is hereby corrected as shown below:

In Column 1, line 14, after "signal" insert --.--.

In Column 7, lines 29-32, Equation 5 should read as follows:

$$A_S = \frac{I_2}{I_1} \cong e^{\frac{2nV_T \frac{V_{in}}{R_E I_o}}{V_T}} = e^{\frac{2nV_{in}}{R_E I_o}}$$

In Column 7, line 60, after "to" insert --a--.

Signed and Sealed this

Twenty-fifth Day of August, 1992

Attest:

DOUGLAS B. COMER

*Attesting Officer*     Acting Commissioner of Patents and Trademarks